United States Patent
Hata et al.

(10) Patent No.: US 7,384,730 B2
(45) Date of Patent: Jun. 10, 2008

(54) TOP COATING COMPOSITION FOR PHOTORESIST AND METHOD OF FORMING PHOTORESIST PATTERN USING SAME

(75) Inventors: Mitsuhiro Hata, Gyeonggi-do (KR); Man-Hyoung Ryoo, Gyeonggi-do (KR); Sang-Gyun Woo, Gyeonggi-do (KR); Hyun-Woo Kim, Gyeonggi-do (KR); Jin-Young Yoon, Seoul (KR); Jung-Hwan Hah, Gyeonggi-do (KR)

(73) Assignee: Samsung Electronics Co., Ltd. (KR)

( * ) Notice: Subject to any disclaimer, the term of this patent is extended or adjusted under 35 U.S.C. 154(b) by 49 days.

(21) Appl. No.: 11/281,775

(22) Filed: Nov. 17, 2005

(65) Prior Publication Data

US 2006/0111550 A1   May 25, 2006

(30) Foreign Application Priority Data

Nov. 19, 2004   (KR) ...................... 10-2004-0094925

(51) Int. Cl.
*G03F 7/38* (2006.01)
*H01L 21/027* (2006.01)
*G03F 7/11* (2006.01)

(52) U.S. Cl. .................. 430/325; 430/326; 430/273.1; 430/945; 430/961; 430/311; 430/327; 430/330; 526/245; 526/243; 526/271; 526/260; 526/318

(58) Field of Classification Search ................ 430/325, 430/326

See application file for complete search history.

(56) References Cited

U.S. PATENT DOCUMENTS 3,895,949 A * 7/1975 Akamatsu et al. ........ 430/275.1

(Continued)

FOREIGN PATENT DOCUMENTS

JP   07-253674   10/1995

(Continued)

OTHER PUBLICATIONS

Electrovert Solder Technology Glossary, Speedline technologies, 17 pages, 2004 copyright date.*

(Continued)

*Primary Examiner*—Cynthia Hamilton
(74) *Attorney, Agent, or Firm*—Myers Bigel Sibley & Sajovec

(57) ABSTRACT

Top coating compositions capable of being used in immersion lithography, and methods of forming photoresist patterns using the same, are provided. The top coating composition includes: a polymer, a base; and a solvent, wherein the polymer may be represented by Formula I:

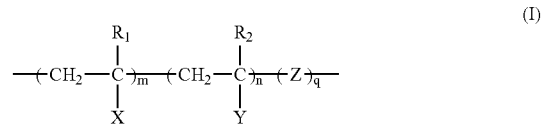

wherein $R_1$ and $R_2$ are independently selected from the group consisting of hydrogen, fluoro, methyl, and trifluoromethyl;

X is a carboxylic acid group or a sulfonic acid group;

Y is a carboxylic acid group or a sulfonic acid group, wherein the carboxylic acid group or sulfonic acid group is protected;

Z is a monomer selected from the group consisting of a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof;

and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein the solvent includes deionized water.

53 Claims, 6 Drawing Sheets

U.S. PATENT DOCUMENTS

| | | | |
|---|---|---|---|
| 4,346,164 A | | 8/1982 | Taberelli et al. ............ 430/311 |
| 5,410,005 A | * | 4/1995 | Nemoto et al. ............. 526/245 |
| 2001/0003030 A1 | * | 6/2001 | Jung et al. ............... 430/273.1 |

FOREIGN PATENT DOCUMENTS

KR          10-0399848         10/2003

OTHER PUBLICATIONS

Dietz, Karl, Circuitree, Tech Talk: Fine Lines in High Yeild (part LVII); Wet Lamination of Dry film Photoresi, www.cricuitree.com;CDA/Archives, Jul. 1, 2000, 11 pages.*

CalGOLD, Pollution Prevention (P2) for Printed Circuit Board Manufactureing 3672 from www.calgold, ca.gov?P2/3672.htm, 3 pages 3, source date listed 1989.*

Deionized water-Wikipedia, the free encyclopedia, two pages dated Jun. 28, 2006.*

Yoshida et al., "Development Status of High Performance Materials for Immersion Lithography", Journal of Photopolymer Science and Technology, vol. 17, No. 4, 2004, pp. 603-608.

Dammel et al., "193 nm Immersion Lithography—Taking the Plunge", Journal of Photopolymer Science and Technology, vol. 17, No. 4, 2004, pp. 587-602.

* cited by examiner

TOP COATING COMPOSITION FOR PHOTORESIST AND METHOD OF FORMING PHOTORESIST PATTERN USING SAME

CROSS-REFERENCE TO RELATED PATENT APPLICATIONS

This application claims the benefit of Korean Patent Application No. 10-2004-0094925, filed on Nov. 19, 2004, in the Korean Intellectual Property Office, the disclosure of which is incorporated herein in its entirety by reference.

FIELD OF THE INVENTION

The present invention relates to top coating compositions for photoresists and methods of forming photoresist patterns using the same. More particularly, the present invention relates to top coating compositions for photoresists that can be used in immersion lithography, and methods of forming photoresist patterns using the same.

DESCRIPTION OF THE RELATED ART

In immersion lithography, the space between the projection lens and the wafer may be filled with a liquid, which, in some cases, improves lithographic performance. A general example of immersion lithography may be found in U.S. Pat. No. 4,346,164.

In lithography, resolution may be improved by decreasing the wavelength of the light source or increasing the numerical aperture of the lithographic system. The numerical aperture is given by $NA = n \sin \alpha$, wherein n is the refractive index of the medium between the lens and the wafer, and $\alpha$ is the angle between the optical axis and the light that enters into the object lens farthest from the optical axis. In immersion lithography, n is increased relative to air, so that the numerical aperture is greater than 1, and may be greater than or equal to 1.3 or 1.4, thus improving the resolution. In particular, when water (n=1.44) is used as the immersion medium, the resolution and depth of focus (DOF) may be improved.

However, the use of water as an immersion liquid may result in several problems. For example, photoresist components, such as photoacid generators (PAGs) or bases, may leach into the water. In order to solve this problem, a top barrier coating may be applied to the photoresist, a technique that is discussed in R. R. Dammel, F. M. Houlihan, R. Sakamuri, D. Rentkiewics, and A. Romano, *J. Photopol. Sci. Tech.*, 587, 4 (2004). When a top barrier coating is applied, the immersion medium does not directly contact the photoresist, and thus leaching of the photoresist components is reduced.

Ideally, a barrier top coating composition for immersion lithography is water-insoluble during exposure, has low absorbance at the wavelength of the exposure light source, is soluble in a developing solution after exposure, and does not inter-mix with the photoresist. An organic solvent-based barrier top coating (see, for example, M. Yoshida, K. Endo, K. Ishizuka, and M. Sato, *J. Photopol. Sci. Tech.*, 603, 4(2004)) may have many of these properties. However, since the top coating may then be relatively non-polar, the formation of a top coating/photoresist inter-mixing layer can often not be avoided.

In addition, the relative hydrophobicity of conventional barrier top coating compositions may produce microbubbles in a top barrier coating film that is coated on a photoresist layer. This is generally undesirable as microbubbles may cause the refractive index of the immersion medium to vary locally according to exposure temperature.

SUMMARY OF THE INVENTION

Embodiments of the present invention provide top coating compositions that may protect photoresist components from dissolving into the immersion medium during immersion lithography.

In some embodiments of the present invention, methods of forming photoresist patterns suitable for an immersion lithography process are provided Some embodiments of the present invention provide top coating compositions, including a polymer, a base, and a solvent, wherein the polymer includes the following repeat units:

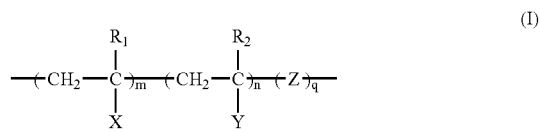

(I)

wherein $R_1$ and $R_2$ may be hydrogen, fluoro, methyl, and trifluoromethyl;

X may be a carboxylic acid group or a sulfonic acid group;

Y may be a carboxylic acid group or a sulfonic acid group, wherein the carboxylic acid group or sulfonic acid group is protected;

Z may be a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof;

and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein the solvent includes deionized water.

The top coating composition may further include an acid generator, such as a thermal acid generator (TAG), a surfactant, and/or a fluorinated additive. The solvent may further include an organic solvent.

Some embodiments of the present invention provide methods of forming photoresist patterns including: 1) forming a photoresist layer on a substrate; 2) forming a topcoating layer on the photoresist, wherein the top coating layer is formed from a top coating composition according to an embodiment of the invention; 3) exposing a region of the photoresist layer coated with the top coating layer through an immersion medium; 4) removing the water-insoluble top coating layer; and 5) developing the exposed photoresist layer.

DETAILED DESCRIPTION OF THE INVENTION

Figure 1A:
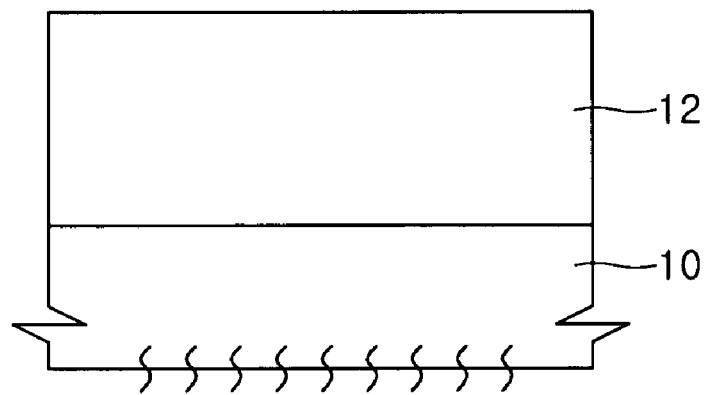
FIGS. 1A to 1E are cross-sectional views illustrating methods of forming photoresist patterns according to some embodiments of the present invention.

The invention is described more fully hereinafter with reference to the accompanying drawings in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. In the drawings, the size and relative sizes of layers and regions may be exaggerated for clarity.

It will be understood that when an element or layer is referred to as being "on," "connected to," or "coupled to" another element or layer, it can be directly on, connected to, or coupled to the other element or layer, or intervening elements or layers may be present. In contrast, when an element is referred to as being "directly on," "directly connected to," or "directly coupled to" another element or layer, there are no intervening elements or layers present. Like numbers refer to like elements throughout. As used herein, the term "and/or" includes any and all combinations of one or more of the associated listed items. It will be understood that, although the terms first, second, third etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional illustrations that are schematic illustrations of idealized embodiments (and intermediate structures) of the invention. As such, variations from the shapes of the illustrations as a result, for example, of manufacturing techniques and/or tolerances, are to be expected. Thus, embodiments of the invention should not be construed as limited to the particular shapes of regions illustrated herein but are to include deviations in shapes that result, for example, from manufacturing. Thus, the regions illustrated in the figures are schematic in nature and their shapes are not intended to illustrate the actual shape of a region of a device and are not intended to limit the scope of the invention.

The terminology used herein is for the purpose of describing particular embodiments only and is not intended to be limiting of the invention. As used herein, the singular forms "a", "an," and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

As used herein:

The term "protecting group," or "protected," refers to a chemical functional group that is attached to a carboxylic acid or a sulfonic acid in order to alter the solubility properties of the carboxylic acid or sulfonic acid group, or to render it inert to one or more chemical processes. Examples of protecting groups according to the present invention include alkyl, hydroxyalkyl, fluoroalkyl, norbornyl, 3-tetrahydrofuranyl, 3-oxocyclohexyl, γ-butyllactone-3-yl, mevalonic acid lactone, γ-butyrolactone-2-yl, 3-methyl-γ-butyrolactone-3-yl, 2-tetrahydropyranyl, 2-methyl-2-tetrahydropyranyl, 2-tetrahydrofuranyl, 2-methyl-2-tetrhydrofuranyl, 2,3-propylenecarbonate-1-yl, 1-methoxyethyl, 1-methoxypropyl, 1-methoxy-1-methylethyl, 1-ethoxyethyl, 1-ethoxypropyl, 1-ethoxy-1-methylethyl, 1-(2-methoxyethoxy)ethyl, 1-(2-acetoxyethoxy)ethyl, t-butoxyethyl, t-butoxycarbonylmethyl, 2-acetylmenth-1-yl, methoxymethyl, and ethoxymethyl. In some embodiments, the protecting group will be acid-labile so that when an acid is applied to the polymer, the protecting group may be removed.

The term "alkyl" refers to a linear, branched, or cyclic alkyl group of 1-20 carbon atoms, which may also contain heteroatoms, such as O, S, N or F. In some embodiments, the alkyl may be a $C_1$-$C_{10}$ alkyl, including tert-butyl, 2,2,3-trimethylbutyl, and the like. Other cyclic alkyls include 2-methyl-2-adamantyl, 2-ethyl-2-adamantyl, and 8-ethyl 8-tricyclodecanyl.

The term "hydroxyalkyl" refers to an alkyl as defined herein, whereby one or more of the hydrogen atoms of the alkyl group is substituted with a hydroxyl group.

The term "fluoralkyl" refers to an alkyl group, as defined herein, wherein one or more hydrogen atoms are substituted with a fluoro group.

The term "carboxylic acid group" refers to a carboxylic acid or an alkyl group, as defined herein, having a carboxylic acid attached thereto.

The term "sulfonic acid group" refers to a sulfonic acid or an alkyl group, as defined herein, having a sulfonic acid attached thereto.

In referring to a polymer, the phrase "comprises the following repeat units" is used to indicate that the polymer contains the recited monomer repeat units, but may also include other monomeric repeat units. The order of the monomeric units provided herein is not meant to limit the order of the monomeric units of the polymers included in embodiments of the present invention. For example, a polymer depicted as having the repeat units of Formula I may have the monomeric units (as denoted by subscripts m, n, and q) in any order, whereby the order of the monomeric units may be random, semi-random, or in a defined order. Repeating monomeric units are therefore also included. In addition, when a monomeric repeat unit may include one of two or more possible functional groups, it is meant that the polymer may contain either of the groups, or it may contain a mixture of both groups. For example, in Formula I, Group X is defined as being a carboxylic acid group or a sulfonic acid group. Embodiments according to the present invention include polymers wherein X is only a carboxylic acid; polymers wherein X is only a sulfonic acid; and polymers wherein X is a carboxylic acid for some of "m" monomeric units, and X is a sulfonic acid for other "m" monomeric units.

The term "activating" is meant to refer to any process or processes by which the top coating layer becomes water insoluble.

Top coating compositions according to some embodiments of the present invention may be used to form barrier top coating layers that reduce the leaching of photoresist components from the photoresist layer during the exposure process in immersion lithography.

Top coating compositions according to some embodiments of the present invention, include a polymer, a base and a solvent, wherein the polymer includes the following repeat units

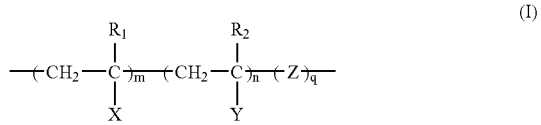

(I)

wherein $R_1$ and $R_2$ are independently selected from the group consisting of hydrogen, fluoro, methyl, and trifluoromethyl;

X is a carboxylic acid group or a sulfonic acid group;

Y is a carboxylic acid group or a sulfonic acid group, wherein the carboxylic acid group or sulfonic acid group is protected;

Z is a monomer selected from the group consisting of a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof;

and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein the solvent includes deionized water.

In some embodiments according to the invention, the top coating composition includes a polymer, a base, and a solvent, wherein the polymer includes the following repeat units:

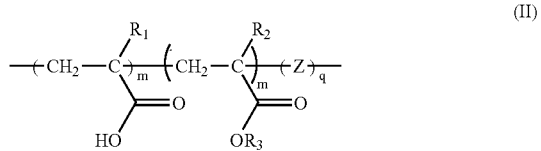

(II)

wherein $R_1$ and $R_2$ are independently selected from the group consisting of hydrogen, fluoro, methyl, and trifluoromethyl;

$R_3$ is a protecting group;

Z is a monomer selected from the group consisting of a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof; and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein said solvent includes deionized water.

In some embodiments, the protecting group of $R_3$ may be $C_1$ to $C_{10}$ alkyl, t-butyl, isonorbornyl, 2-methyl-2-adamantyl, 2-ethyl-2-adamantyl, 3-tetrahydrofuranyl, 3-oxocyclohexyl, γ-butyllactone-3-yl, mevalonic acid lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, and ethoxymethyl.

Suitable Z monomers include vinylalcohol, vinylacetate, vinylacetal, methylvinylether, ethylvinylether, vinylsulfonic acid, ethyleneglycol, propyleneglycol, and the like.

In some embodiments of the present invention, $0.15 \leq m/(m+n+q) \leq 0.85$; and $0.15 \leq n/(m+n+q) \leq 0.85$.

Polymers included in the top coating composition, according to some embodiments of the present invention, may have a weight average molecular weight ($M_w$) in a range of about 1,000 to about 100,000 daltons, and in some embodiments, may be in a range of about 2,000 to about 50,000 daltons. In some embodiments, the concentration of the polymer is in a range of about 0.1 to about 5.0% by weight, and in some embodiments, in a range of about 0.5 to about 1.0% by weight, based on the total weight of the top coating composition.

According to some embodiments of the present invention, the top coating composition includes a base, which may act to increase the water solubility of the polymer contained in the top coating composition. In some embodiments, the concentration of the base may be adjusted so that the polymer does not dissolve in pure deionized water but does dissolve in a solution mixture of deionized water and an organic solvent.

According to some embodiments, the base includes an amine or a tetraalkylammonium hydroxide. In particular, in some embodiments, the base may be ethylamine, ammonia, monoethanolamine, triethanolamine, and/or tetramethylammonium hydroxide.

According to some embodiments of the invention, the concentration of the base may be in a range of about 0.01 to about 0.3% by weight, and in some embodiments, in a range of about 0.04 to about 0.1% by weight, based on the total weight of the top coating composition.

According to some embodiments of the present invention, the top coating composition includes an acid generator. In some embodiments, the acid generator is a thermal acid generator (TAG). Suitable TAGs may include KUMHO TAG lot #020114 (obtained from KUMHO ASAN Lab.) and 1-p-toluenesulfonate-2-hydroxycyclohexane.

In some embodiments of the present invention, the concentration of the TAG may be in a range of about 0.05 to about 0.3% by weight, and in some embodiments, in a range of about 0.08 to about 0.2% by weight, based on the total weight of the top coating composition.

The addition of an acid generator to a top coating composition may enable the coating to become water-insoluble during the immersion lithography process. Specifically, a polymer of an embodiment of the present invention that is included in the top coating composition may become water-insoluble under certain conditions when an acid generator is present. However, any method by which the polymer becomes water-insoluble may be used, so that in some embodiments, the acid generator may be excluded.

According to some embodiments of the present invention, the top coating composition includes a surfactant. A surfactant included in the top coating composition may create a more uniform coating of the top coating composition. A variety of surfactants, including both fluorinated and non-fluorinated surfactants, may be used, and the surfactants may be used alone or in combination. Suitable surfactants may include Fluorad™ (obtained from 3M), NONIPORU™ (obtained from SANYO KASEI), MEGAFACE™ (obtained from Dainippon Ink & Chemicals), and Zonyl-FSN (obtained from DuPont). In some embodiments, the concentration of the surfactant may be in a range of about 0.001 to about 0.01% by weight, based on the total weight of the top coating composition.

According to some embodiments of the present invention, the top coating composition includes a fluorinated additive. The presence of a fluorinated additive in a top coating composition may increase the transmittance of the top coating layer. For example, a fluorinated additive may be included in a top coating layer, formed according to an embodiment of the present invention, which is exposed to a wavelength of light of 193 nm. Suitable fluorinated additives may include tetramethylammonium trifluoroacetate, tetramethylammonium pentafluoropropionate, tetramethylammonium heptafluorobutyrate, tetramethylammonium nonafluorovalerate, tetramethylammonium undecafluorohexanate, tetramethylammonium tridecafluoroheptanate, tetramethylammonium pentadecafluorooctanate, tetramethylammonium heptadecafluorononanate, tetramethylammonium nonadecafluorodecanate, tetramethylammonium perfluoroundecanate, tetramethylammonium tricosafluorododecanate, tetramethylammonium perfluorotetradecanate, tetramethylammonium heptadecafluorooctanesulfonate, and tetramethylammonium nonafluorobutane-1-sulfonate, or combinations thereof.

In some embodiments of the invention, the concentration of the fluorinated additive may be in a range of about 0.01 to about 0.3% by weight, based on the total amount of fluorinated additive in the top coating composition.

According to some embodiments of the present invention, the top coating composition includes a solvent that includes water. In some embodiments, the solvent is primarily deionized water. In some embodiments, the solvent includes deionized water and an organic solvent. Suitable organic solvents may include alkanols, nitrites, ketones, esters, and lactate esters. Deionized water and the organic solvent are, in some embodiments, mixed in a ratio of about 99:1 to about 50:50, and, in some embodiments, in a ratio of about 95:5 to about 75:25.

According to some embodiments of the present invention, methods of forming photoresist patterns include an immersion lithography process. In some embodiments, a photoresist layer is coated with a top coating composition of an embodiment of the present invention, to form a top coating layer, which may act as a barrier, so that leaching of the photoresist components into a liquid immersion medium, e.g., water, may be reduced.

FIGS. 1A to 1E are cross-sectional views illustrating methods of forming photoresist patterns according to some embodiments of the present invention.

Referring to FIG. 1A, a photoresist layer 12 is formed on a semiconductor substrate 10 on which a predetermined layer to be etched is formed. In some embodiments, the photoresist layer 12 may be composed of a conventional chemically amplified resist composition containing a photo acid generator (PAG). A chemically amplified resist composition may, for example, be a resist composition for a KrF excimer laser (248 nm), an ArF excimer laser (193 nm), or a $F_2$ excimer laser (157 nm). The photoresist layer 12 may, in some embodiments, be composed of a positive resist composition, and, in some embodiments, be composed of a negative resist composition.

In some embodiments of the present invention, the photoresist layer 12 formed on the semiconductor substrate 10 is softly baked at a temperature in a range of about 105° C. to about 130° C.

Figure 1B:
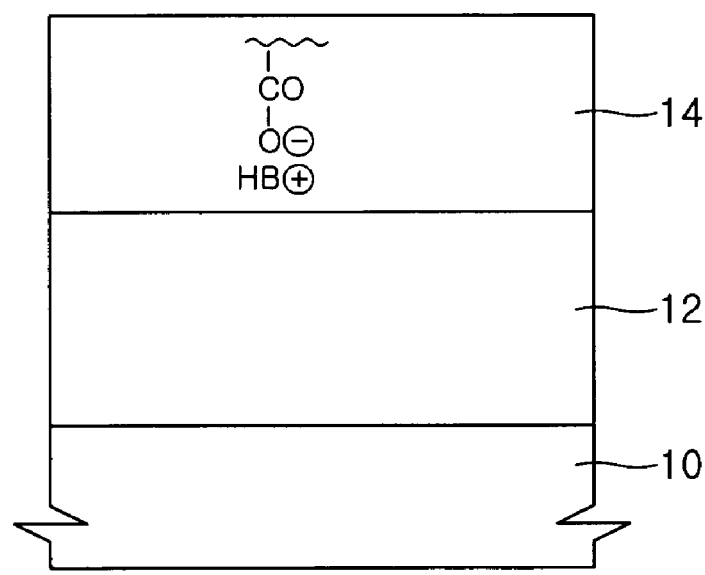

Referring to FIG. 1B, the photoresist layer 12 is spin-coated with a top coating composition of an embodiment of the invention, thus forming a top coating layer 14. In the present embodiments, the top coating composition includes an acid generator. Spin coating is performed, in some embodiments, at a rotational velocity in a range of about 500 to about 3000 rpm, for a time in the range of about 30 to about 90 seconds, in order to form the top coating layer 14.

In a top coating composition according to an embodiment of the present invention, the carboxylic acid group or sulfonic acid group of the polymer may react with the base to increase the water solubility of the polymer. FIG. 1B illustrates an acid/base complex that may be formed between the base and a carboxylic acid. As will be understood by those skilled in the art, the sulfonic acid group may form an acid/base complex in the same manner.

Figure 1C:
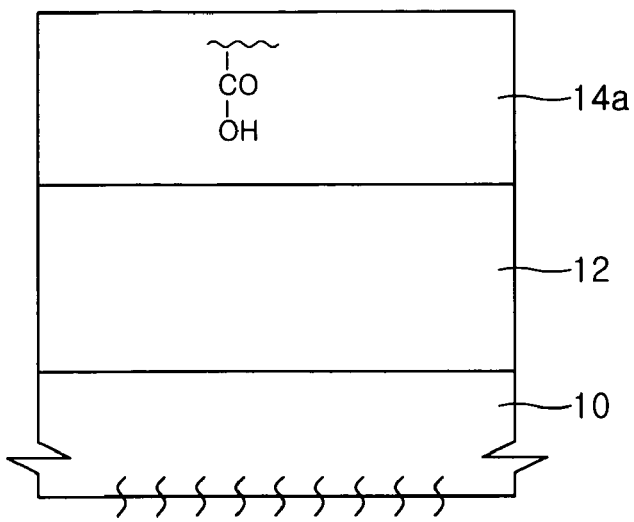

Referring to FIG. 1C, when the carboxylic acid group or sulfonic acid group of the polymer and the base in the top coating layer 14 are separated from each other, a water-insoluble top coating layer 14a may be formed. In some embodiments, a TAG contained in the top coating composition may be used to render the top coating composition water insoluble.

In order to form the water-insoluble top coating layer 14a, according some embodiments, the top coating layer 14 formed on the semiconductor substrate 10 is heat-treated, thus producing an acid from the TAG. In some embodiments, the top coating layer 14 is heat-treated at a temperature lower than the temperature used to softly bake the photoresist layer 12, as described with reference to embodiments depicted in FIG. 1A. The temperature for the heat treatment of the water-insoluble top coating layer 14a, in some embodiments, is in a range of about 100 to about 120° C. As a result of the heat treatment, the base contained in the top coating layer 14 may react with the acid produced from the TAG, such that a salt is produced and the polymer becomes water-insoluble, as illustrated in FIG. 1C, in which a carboxyl acid group is depicted.

Figure 1D:
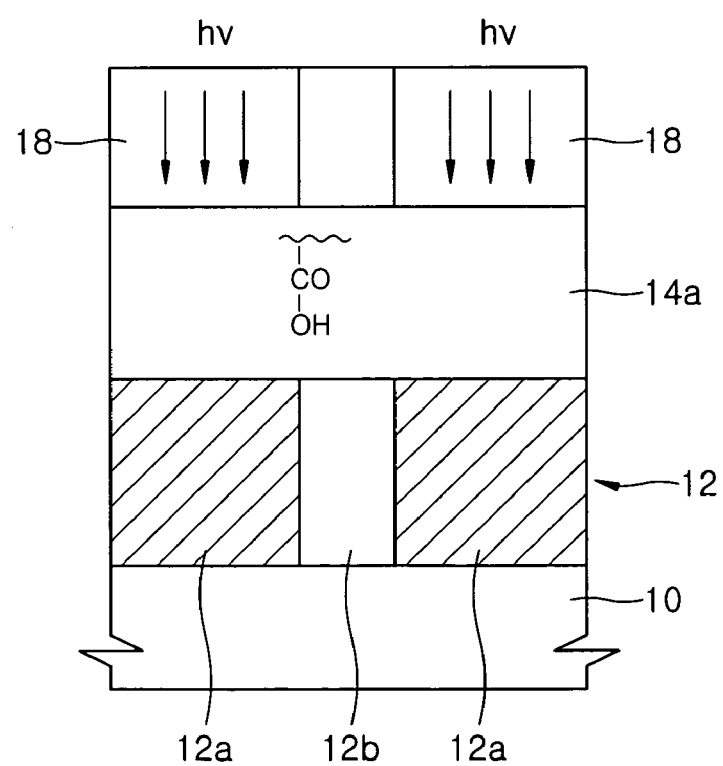

Referring to FIG. 1D, a predetermined portion of the photoresist layer 12 coated with the water-insoluble coating layer 14a is exposed via a liquid medium 18 to a light source, for example, a light source from a KrF excimer laser (248 nm), an ArF excimer laser (193 nm), or an $F_2$ excimer laser (157 nm). After the exposure, the photoresist layer 12 may then be divided into an exposed region 12a and a non-exposed region 12b.

In some embodiments of the present invention, the liquid medium 18 includes water. In this case, the water-insoluble top coating layer 14a, interposed between the photoresist layer 12 and the liquid medium 18, may act as a barrier that reduces leaching of the photoresist components in the photoresist layer 12 into the liquid medium 18.

In addition, in some embodiments, the water-insoluble top coating layer 14a may act as a top anti-reflective coating (TARC) since the refractive index of the water-insoluble top coating layer 14a may adjust during the immersion lithography process. To perform as a TARC, the optimal refractive index of the water-insoluble top coating layer 14a is given by $$n_t = (n_{il} \cdot n_{pr})^{1/2}$$

where $n_t$ is the refractive index of the water-insoluble top coating layer 14a, $n_{il}$ is the refractive index of the liquid medium 18, and $n_{pr}$ is the refractive index of the photoresist layer 12.

Figure 1E:
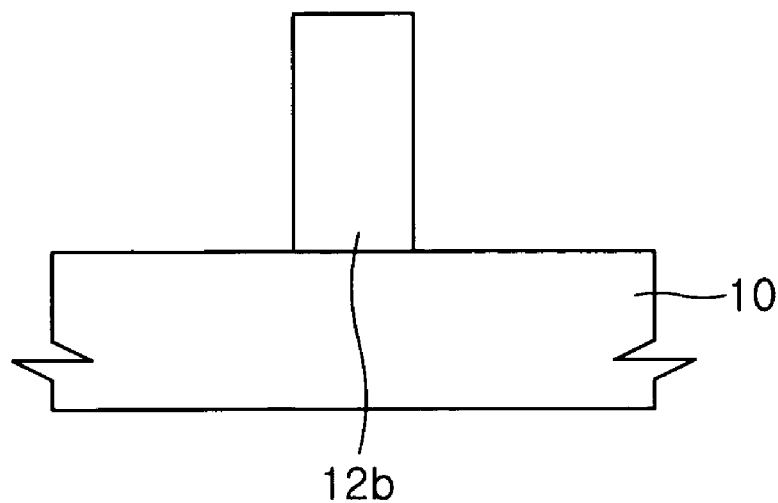

Referring to FIG. 1E, after exposure via the liquid medium 18 is completed, the exposed photoresist layer 12 may be subjected to post-exposure baking (PEB). In some embodiments, the water-insoluble top coating layer 14a is removed and the exposed photoresist layer 12 is developed. In embodiments where the polymer contained in the water-insoluble top coating layer 14a includes a protecting group that is acid-labile, after PEB, the polymer of the water-insoluble top coating layer 14a may be deprotected by an acid, for example, an acid that is diffused from the photoresist layer 12 and/or an acid produced by the TAG. As a result of the deprotection, the water-insoluble top coating layer 14a may be developed using an alkali developing solution. Accordingly, in some embodiments, the removal of the water-insoluble top coating layer 14a and the development of the photoresist layer 12 are performed at the same time. The alkaline developing solution may, in some embodiments, be an alkylammonium hydroxide aqueous solution, e.g. a 2.38% tetramethylamonium hydroxide aqueous solution.

After the developing process is completed, a photoresist pattern may be result from the photoresist layer 12 on the semiconductor substrate 10. When the photoresist layer 12 is composed of a positive resist composition, only the non-exposed region 12b remains on the semiconductor substrate 10, as illustrated in FIG. 1E. In this case, the photoresist pattern is formed of the non-exposed region 12b. In contrast, if the photoresist layer 12 is composed of a negative resist composition, only the exposed region 12a would remain on the semiconductor substrate 10 when forming the photoresist pattern.

FIGS. 2A to 2F are cross-sectional views illustrating other methods of forming a photoresist patterns according of the present invention. These embodiments are similar to or the same as the embodiments shown with reference to FIGS. 1A-1E, except in the embodiments of FIGS. 2A-2F, the water-insoluble top coating layer is formed in a different manner. Accordingly, the methods of these embodiments will only be briefly described, with an emphasis on the differences between the present embodiments and those described with reference to FIGS. 1A-1E.

Figure 2A:
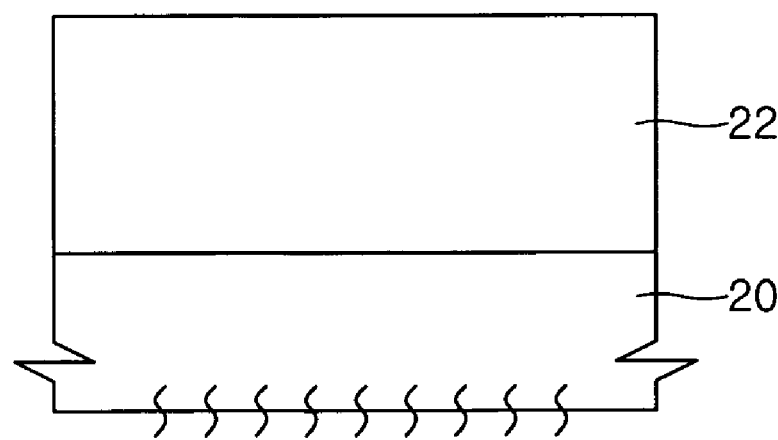
FIGS. 2A to 2F are cross-sectional views illustrating methods of forming photoresist patterns according to some embodiments of the present invention.

Referring to FIG. 2A, a photoresist layer 22 is formed on a semiconductor substrate 20 in a manner similar to or the same as described with reference to FIG. 1A.

Figure 2B:
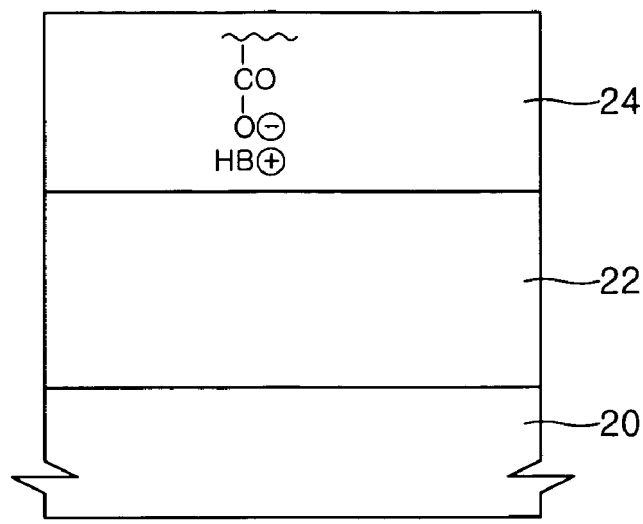

Referring to FIG. 2B, a top coating layer 24 is formed on a photoresist layer 22 in a manner similar to or the same as described with reference to FIG. 1B. In the present embodiments, the composition used to form the top coating layer 24 does not include a TAG.

Figure 2C:
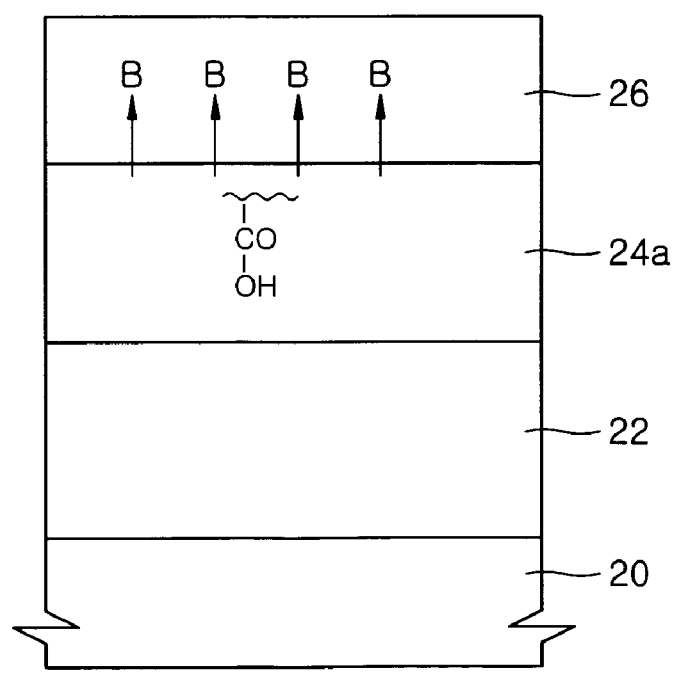

Referring to FIG. 2C, a water-insoluble top coating layer 24a is formed by soaking the top coating layer 24 in water 26.

In some embodiments of the present invention, the top coating layer 24 is soaked in water 26, thus leaching a base (B) contained in the top coating layer 24a into the water 26. In some embodiments, the top coating layer 24 is spin-cleaned with the water 26 at, for example, a rotational velocity in a range of about 500 to about 3000 rpm, and in some embodiments, in a range of about 2000 to about 3000 rpm. In some embodiments, the top coating layer 24 may soak with water thereon for a predetermined period, for example, for a time in a range of about 30 to about 90 sec. During this soaking process, the base contained in the top coating layer 24 may leach into the water 26 and the polymer contained in the top coating layer 24 may become water-insoluble, as illustrated in FIG. 2C, in which the depicted polymer includes carboxylic acid group. In some embodiments, part of the top coating layer 24 may dissolve and the thickness of the top coating layer 24 may decrease. However, the loss of the thickness does not generally exceed about 30 Å, regardless of the thickness of the top coating layer 24 or the contact time between the top coating layer 24 and the water 26.

Figure 2D:
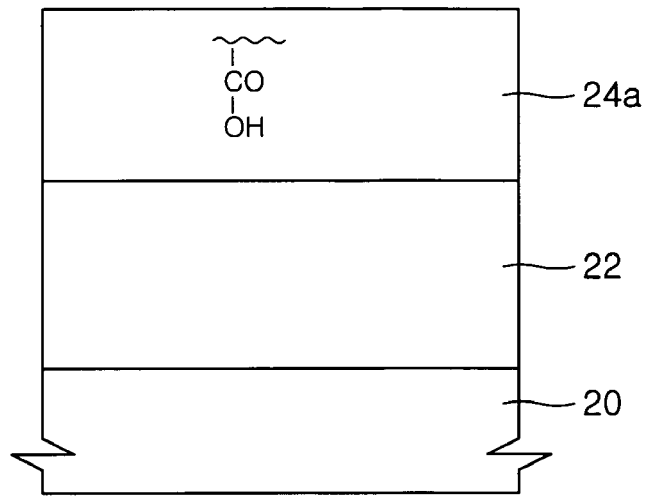

Referring to FIG. 2D, the water 26 existing on the water-insoluble top coating layer 24a is removed using a spin dry process.

Figure 2E:
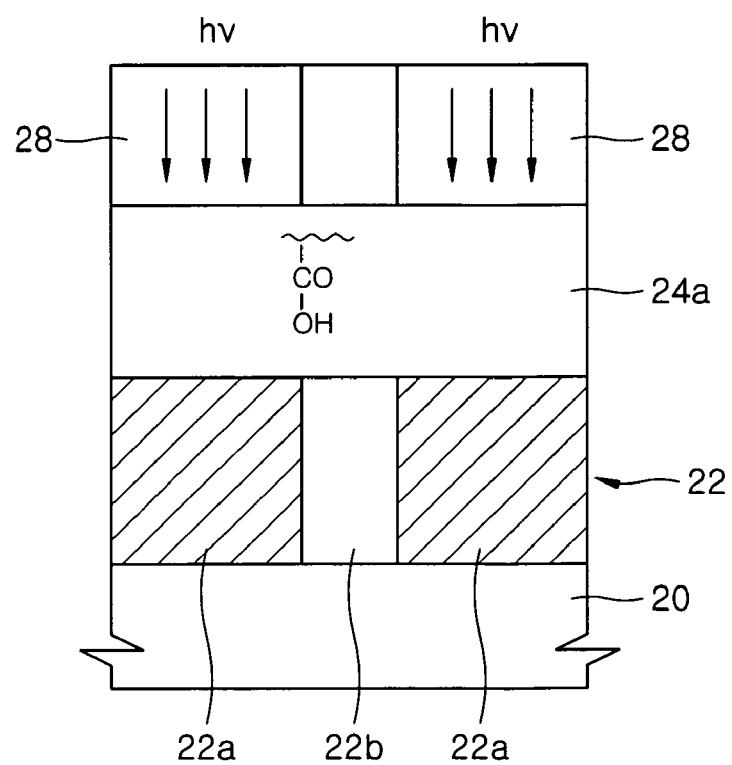

Referring to FIG. 2E, a predetermined portion of the photoresist layer 22 coated with the water-insoluble coating layer 24a is exposed via a liquid immersion medium 28, in a manner similar to or the same as that described with reference to FIG. 1D. After exposure, the photoresist layer 22 may be divided into an exposed region 22a and a non-exposed region 22b.

Figure 2F:
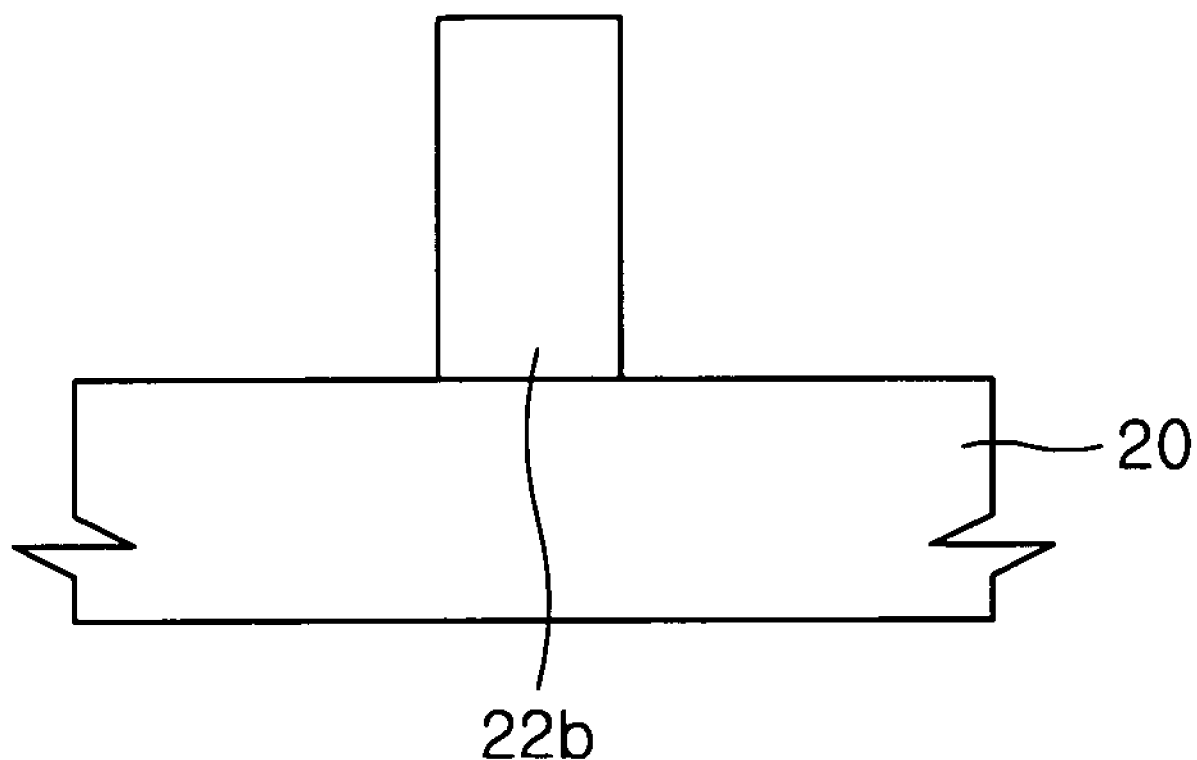

Referring to FIG. 2F, the removal of the water-insoluble top coating layer 24a and the development of the photoresist layer 22 may be performed at the same time, in a manner similar to or the same as that described with reference to FIG. 1E. In some embodiments, the non-exposed region 22b of the photoresist layer 22 remains on the semiconductor substrate 20.

According to some embodiments of the present invention, a potential leaching component contained in the top coating layer 24, for example, a solvent, can be removed by soaking the top coating layer 24 in the water 26. Therefore, in the subsequent exposure process via the liquid immersion medium 28, the dissolution rate of the top coating layer 24 into the liquid immersion medium 28 may be reduced. In addition, in some embodiments, the heat treatment process, which may render the top coating layer 24 water-insoluble, as described with reference to FIG. 1C, can be omitted. The omission of the heat treatment process may result in advantages, such as a decrease in the thermal damage of the photoresist layer 22 and/or a decrease in the amount of processing steps and/or equipment needed to perform the lithographic process. For example, a hot plate for a heat treatment process and a cooling plate for a cooling process may not be necessary, thus simplifying the manufacturing process.

Top coating compositions and photoresist patterns formed therefrom, according to some embodiments of the present invention, will now be described through the following examples.

The examples should be considered in a descriptive sense only and not for purposes of limitation. It will be understood by those skilled in the art that various changes in form and details may be made in the Examples without departing from the spirit and scope of the invention.

EXAMPLES

Example 1

Example 1-1

Synthesis of a Top Coating Composition 950 mg of ethanol and 3 mg of triethanolamine dissolved in 297 mg of $H_2O$ were added to 50 mg of poly(methacrylic acid-co-t-butylmethacrylate) (methacrylic acid:t-butylmethacrylate=8:2). After complete dissolution, 3.7 g of $H_2O$ and 5 mg of KUMHO TAG (lot#020114) were added to the resultant mixture, and filtered to give a clear solution of a top coating composition.

Example 1-2

Barrier Characteristics of a Top Coating Layer

The top coating composition synthesized in Example 1-1 was spin-coated onto an 8 inch bare-Si wafer having an organic layer formed thereon, thus forming a uniform top coating layer. The resultant wafer was baked at 105° C. for 90 sec, and then rinsed with deionized water for 90 sec. At this time, the dissolution rate of the top coating layer was 0.156 Å/s. The theoretical refractive index $n_t$ of the top coating layer can be calculated by the following formula: $n_t=(n_{DIW} \cdot n_{pr})^{1/2}$, where $n_{DIW}$ is the refractive index of deionized water and $n_{pr}$ is the refractive index of the photoresist layer. In this case, $n_{DIW}$ is 1.44 and $n_{pr}$ is 1.7. Accordingly, the theoretical refractive index of the top coating layer is 1.56. However, the refractive index n and absorbance k of the top coating layer measured with a 193 nm light source were 1.410 and 0.435, respectively.

The wafer was baked at 120° C. for 60 sec, and developed with a 2.38% by weight of tetramethylammonium hydroxide aqueous solution. As a result, the top coating layer was completely removed, and no residue was observed.

Example 1-3

Immersion Lithography Process with the Top Coating Layer

A photoresist pattern was formed using an immersion lithography process using a top coating layer, according to some embodiments of the present invention. Barrier characteristics of the top coating layer were measured. In this case, during the exposure, mimic immersion lithography was performed instead of exposure via a liquid immersion medium. That is, a substrate to be exposed was immersed in deionized water for 60 sec, dry-exposed, and then immersed in deionized water for 60 sec.

An anti-reflective coating (ARC) material used at an exposure wavelength of 193 mm was spin-coated on an 8-inch bare silicon wafer, and then baked to form an ARC layer with a thickness of about 300 Å. Then, a photoresist used at an exposure wavelength of 193 nm was spin-coated on the ARC layer, and then baked at 110° C. for 60 sec, thus forming a photoresist layer with a thickness of about 1800 Å. The top coating composition of Example 1-1 was spin coated on the photoresist layer, thus forming a uniform top coating layer. The top coating layer was baked at 105° C. for 90 sec. The resultant substrate was soaked in deionized water, exposed to an ArF excimer laser at 193 nm, soaked in deionized water for 60 sec, subjected to PEB at 120° C. for 60 sec, and then developed with a 2.38% tetramethylammonium hydroxide aqueous solution. As a result, fine line and space patterns with a pitch of about 180 nm were obtained.

Example 2

Example 2-1

Synthesis of a Top Coating Composition 950 mg of ethanol and 1.5 mg of tetramethylammonium hydroxide dissolved in 148.5 mg of $H_2O$ were added to 50 mg of poly(methacrylic acid-co-t-butylmethacrylate) (methacrylic acid:t-butylmethacrylate=8:2). After complete dissolution, 3.85 g of $H_2O$ and 5 mg of KUMHO TAG (lot#020114) were added to the resultant mixture, and the result was filtered to produce a clear solution of the top coating composition.

Example 2-2

Barrier Characteristics of the Top Coating Layer

The top coating composition manufactured in Example 2-1 was spin-coated on an 8-inch bare-Si wafer having an organic layer formed thereon, thus forming a uniform top coating layer. The result was baked at 105° C. for 90 sec, and then rinsed with deionized water for 90 sec. At this time, the dissolution rate of the top coating layer was 0.400 Å/s. The wafer was baked at 120° C. for 60 sec, and developed with a 2.38% by weight tetramethylammonium hydroxide aqueous solution. As a result, the top coating layer was completely removed, and no residue was observed.

Example 3

Example 3-1

Synthesis of a Top Coating Composition 500 mg of ethanol and 3 mg of triethanolamine dissolved in 297 mg of $H_2O$ were added to 50 mg of poly(methacrylic acid-co-t-butylmethacrylate) (methacrylic acid:t-butylmethacrylate=85:15). After complete dissolution, 4.2 g of $H_2O$ and 5 mg of KUMHO TAG (lot#020114) were added to the resultant mixture, and the result was filtered to provide a clear solution of the top coating composition.

Example 3-2

Barrier Characteristics of the Top Coating Layer

The top coating composition synthesized in Example 3-1 was spin-coated onto an 8-inch bare-Si wafer having an organic layer formed thereon, thus forming a uniform top coating layer. The resultant wafer was baked at 105 C for 90 sec, and then rinsed with deionized water for 90 sec. At this time, the dissolution rate of the top coating layer was 0.611 Å/s. The wafer was baked at 120° C. for 60 sec, and developed with a 2.38% by weight tetramethylammonium hydroxide aqueous solution. As a result, the top coating layer was completely removed, and no residue was observed.

Example 4

Example 4-1

Synthesis of a Top Coating Composition 1500 mg of ethanol and 2 mg of triethanolamine dissolved in 198 mg of $H_2O$ were added to 45 mg of poly(methacrylic acid-co-t-butylmethacrylate) (methacrylic acid:t-butylmethacrylate=80:20). After complete dissolution, 5.0 mg of polyvinylalcohol dissolved in 95 mg of $H_2O$, 8.5 g of $H_2O$, and 5 mg of KUMHO TAG (lot#020114) were added to the resultant mixture, and the result was filtered to provide a clear solution of the top coating composition.

Example 4-2

Barrier Characteristics of the Top Coating Layer

The top coating composition synthesized in Example 4-1 was spin-coated onto an 8 inch bare-Si wafer having an organic layer formed thereon, thus forming a uniform top coating layer. The result was baked at 105° C. for 90 sec, and then rinsed with deionized water for 90 sec. At this time, the dissolution rate of the top coating layer was 0.260 Å/s. The wafer was baked at 120° C. for 60 sec, and developed with a 2.38% by weight tetramethylammonium hydroxide aqueous solution. As a result, the top coating layer was completely removed, and no residue was observed.

Example 5

Example 5-1

Synthesis of a Top Coating Composition 950 mg of ethanol and 3 mg of triethanolamine dissolved in 297 mg of $H_2O$ were added to 50 mg of poly(methacrylic acid-co-t-butylmethacrylate) (methacrylic acid:t-butylmethacrylate=8:2). After complete dissolution, 3.7 g of $H_2O$ was added to the resultant mixture, and the result was filtered to provide a clear solution of the top coating composition.

Example 5-2

Barrier Characteristics of the Top Coating Layer

The top coating composition synthesized in Example 5-1 was spin-coated onto an 8 inch bare-Si wafer having an organic layer thereon. Then, the resultant wafer was subjected to a pre-rinse process for 40 sec using deionized water and a spin dry process, thus forming a uniform top coating layer with a thickness of 156 Å($3\sigma$=13.2). Then, the wafer was rinsed with deionized water for 90 sec. At this time, the dissolution rate of the top coating layer was 0.034 Å/s. The wafer was baked at 120° C. for 60 sec, and developed with a 2.38% by weight tetramethylammonium hydroxide aqueous solution. As a result, the top coating layer was completely removed, and no residue was observed.

Example 6

Example 6-1

Synthesis of a Top Coating Composition 500 mg of ethanol and 1 mg of ethylamine dissolved in 99 mg of $H_2O$ were added to 50 mg of poly(methacrylic acid-co-t-butylmethacrylate) (methacrylic acid:t-butylmethacrylate=8:2) dissolved in 450 mg of ethanol. After complete dissolution, 3.9 g of $H_2O$ was added to the resultant mixture, and the result was filtered to provide a clear solution of the top coating composition.

Example 6-2

Barrier Characteristics of the Top Coating Layer

The top coating composition synthesized in Example 6-1 was spin-coated onto an 8 inch bare-Si wafer having an organic layer. Then, the resultant wafer was subjected to a pre-rinse process for 90 sec with deionized water, and then to a rinse process with deionized water for 90 sec. At this time, the dissolution rate of the top coating layer was 0.144 Å/s. The wafer was baked at 120° C. for 60 sec, and developed with a 2.38% by weight tetramethylammonium hydroxide aqueous solution. As a result, the top coating layer was completely removed, and no residue was observed.

Example 7

Example 7-1

Synthesis of a Top Coating Composition 500 mg of ethanol and 1.23 mg of monoethanolamine dissolved in 122 mg of $H_2O$ were added to 50 mg of poly(methacrylic acid-co-t-butylmethacrylate) (methacrylic acid:t-butylmethacrylate=8:2) dissolved in 450 mg of ethanol. After complete dissolution, 3.88 g of $H_2O$ was added to the resultant mixture, and the result was filtered to provide a clear solution of the top coating composition.

Example 7-2

Barrier Characteristics of the Top Coating Layer

The top coating composition manufactured in Example 7-1 was spin-coated onto an 8-inch bare-Si wafer having an organic layer thereon. Then, the resulting wafer was subjected to a pre-rinse process for 90 sec using deionized water and a spin dry process, thus forming a uniform top coating layer with a thickness of 185 Å($3\sigma$=15). Then, the wafer was rinsed with deionized water for 90 sec. At this time, the dissolution rate of the top coating layer was 0.026 Å/s. The wafer was baked at 120° C. for 60 sec, and developed with a 2.38% by weight tetramethylammonium hydroxide aqueous solution. As a result, the top coating layer was completely removed, and no residue was observed.

Example 8

Example 8-1

Synthesis of a Top Coating Composition 500 mg of ethanol and 119 mg of a 0.3% by weight ammonia aqueous solution were added to 50 mg of poly (methacrylic acid-co-t-butylmethacrylate) (methacrylic acid:t-butylmethacrylate=8:2) dissolved in 450 mg of ethanol. After complete dissolution, 3.88 g of $H_2O$ was added to the resultant mixture, and the result was filtered to provide a clear solution of the top coating composition.

Example 8-2

Barrier Characteristics of the Top Coating Layer

The top coating composition manufactured in Example 8-1 was spin-coated onto an 8 inch bare-Si wafer having an organic layer thereon. Then, the resulting wafer was subjected to a pre-rinse process for 90 sec using deionized water and a spin dry process, thus forming a uniform top coating layer with a thickness of 181 Å($3\sigma$=22). Then, the wafer was rinsed with deionized water for 90 sec. At this time, the dissolution rate of the top coating layer was 0.013 Å/s. The wafer was baked at 120° C. for 60 sec, and developed with a 2.38% by weight tetramethylammonium hydroxide aqueous solution. As a result, the top coating layer was completely removed, and no residue was observed.

While the present invention has been particularly shown and described with reference to exemplary embodiments thereof, it will be understood by those of ordinary skill in the art that various changes in form and details may be made therein without departing from the spirit and scope of the present invention as defined by the following claims.

What is claimed is:

1. A top coating composition comprising a polymer, a base, a thermal acid generator (TAG), and a solvent, wherein the polymer comprises the following repeat units:

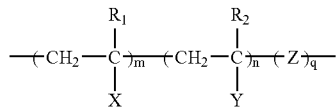

wherein $R_1$ and $R_2$ are independently selected from the group consisting of hydrogen, fluoro, methyl, and trifluoromethyl;

X is a carboxylic acid group or a sulfonic acid group;

Y is a carboxylic acid group or a sulfonic acid group, wherein the carboxylic acid group or sulfonic acid group is protected;

Z is a monomer selected from the group consisting of a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof;

and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein the solvent comprises deionized water.

2. The top coating composition of claim 1, wherein the carboxylic acid group or sulfonic acid group of Y is protected with a protecting group selected from the group consisting of $C_1$ to $C_{10}$ alkyl, t-butyl, isonorbornyl, 2-methyl-2-adamantyl, 2-ethyl-2-adamantyl, 3-tetrahydrofuranyl, 3-oxocyclohexyl, γ-butyllactone-3-yl, mevalonic acid lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, ethoxymethyl, or a combination thereof.

3. The top coating composition of claim 1, wherein the polymer has a weight average molecular weight ($M_W$) in a range of about 1,000 to about 100,000 daltons.

4. The top coating composition of claim 1, wherein the concentration of the polymer is in a range of about 0.1 to about 5.0% by weight, based on the total weight of the top coating composition.

5. The top coating composition of claim 1, wherein the base comprises an amine or a tetraalkylammonium hydroxide.

6. The top coating composition of claim 1, further comprising a surfactant.

7. The top coating composition of claim 1, further comprising a fluorinated additive.

8. A top coating composition according to claim 1, wherein the polymer comprises the following repeat units:

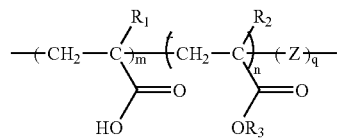

wherein $R_1$ and $R_2$ are independently selected from the group consisting of hydrogen, fluoro, methyl, and trifluoromethyl;

$R_3$ is a protecting group;

Z is a monomer selected from the group consisting of a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof; and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein the solvent comprises deionized water.

9. The top coating composition of claim 8, wherein $R_3$ is selected from the group consisting of $C_1$ to $C_{10}$ alkyl, t-butyl, isonorbornyl, 2-methyl-2-adamantyl, 2-ethyl-2-adamantyl, 3-tetrahydrofuranyl, 3-oxocyclohexyl, γ-butyllactone-3-yl, mevalonic acid lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2acetoxyethoxy)ethyl, t-butoxycarbonylmethyl, methoxymethyl, ethoxymethyl, or a combination thereof.

10. The top coating composition of claim 8, wherein the polymer has a weight average molecular weight ($M_W$) in a range of about 1,000 to about 100,000 daltons.

11. The top coating composition of claim 8, wherein the concentration of the polymer is in a range of about 0.1 to about 5.0% by weight based on the total weight of the top coating composition.

12. The top coating composition of claim 8, wherein the base comprises an amine or a tetraalkylammonium hydroxide.

13. The top coating composition of claim 12, wherein the base comprises ethylamine, ammonia, monoethanolamine, triethanolamine, tetramethylammonium hydroxide, or a combination thereof.

14. The top coating composition of claim 8, wherein the concentration of the base is in a range of about 0.01 to about 0.3% by weight, based on the total weight of the top coating composition.

15. The top coating composition of claim 1, wherein the concentration of the TAG is in a range of about 0.05 to about 0.3% by weight based on the total weight of the top coating composition.

16. The top coating composition of claim 8, further comprising a surfactant.

17. The top coating composition of claim 16, wherein the concentration of the surfactant is in a range of about 0.001 to about 0.01% by weight, based on the total weight of the top coating composition.

18. The top coating composition of claim 8, further comprising a fluorinated additive.

19. The top coating composition of claim 18, wherein the fluorinated additive is selected from the group consisting of tetramethylammonium trifluoroacetate, tetramethylammonium pentafluoropropionate, tetramethylammonium heptafluorobutyrate, tetramethylammonium nonafluorovalerate, tetramethylammonium undecafluorohexanate, tetramethylammonium tridecafluoroheptanate, tetramethylammonium pentadecafluorooctanate, tetramethylammonium heptadecafluorononanate, tetramethylammonium nonadecafluorodecanate, tetramethylammonium perfluoroundecanate, tetramethylammonium tricosafluorododecanate, tetramethylammonium perfluorotetradecanate, tetramethylammonium heptadecafluorooctanesulfonate, tetramethylammonium nonafluorobutane-1-sulfonate, and a combination thereof.

20. The top coating composition of claim 18, wherein the concentration of the fluorinated additive is in a range of about 0.01 to about 0.3% by weight based on the total weight of the top coating composition.

21. The top coating composition of claim 8, wherein the solvent further comprises an organic solvent.

22. The top coating composition of claim 21, wherein the organic solvent comprises an alkanol, a nitrile, a ketone, an ester, a lactate ester, or a combination thereof.

23. The top coating composition of claim 21, wherein the ratio of deionized water to organic solvent is in the range of about 99:1 to about 50:50.

24. A method of forming a photoresist pattern comprising:
forming a photoresist layer on a substrate;
forming a topcoating layer on the photoresist, wherein said top coating layer is formed from the top coating composition of claim 1;
exposing a region of the photoresist layer coated with the top coating layer through an immersion medium;
removing the water-insoluble top coating layer; and
developing the exposed photoresist layer.

25. A method according to claim 24 further comprising:
soft baking the photoresist layer at a first temperature before forming the topcoating layer;
forming the top coating layer by coating the softly baked photoresist layer with the top coating composition;
activating the top coating layer so that it becomes water-insoluble; and
post-exposure baking the exposed photoresist layer after the exposing of the region of the photoresist layer.

26. The method of claim 25, wherein activating the top coating layer comprises heat-treating the top coating layer.

27. The method of claim 26, wherein the heat-treating of the top coating layer is performed at a temperature lower than the softly baking temperature.

28. The method of claim 27, wherein
the softly baking temperature is in a range of about 105 to 130° C., and
the heat-treating temperature is in a range of about 100 to 120° C.

29. The method of claim 25, wherein activating the top coating layer comprises soaking the top coating layer in water to leach the base in the top coating layer into the water.

30. The method of claim 29, wherein the soaking of the top coating layer comprises:
spin cleaning the top coating layer with water; and
applying water to the top coating layer for a period of time.

31. The method of claim 30, wherein
the spin cleaning is performed at a rotational velocity in a range of about 500 to 3000 rpm; and
the time is in a range of about 30 to 90 seconds.

32. The method of claim 24, wherein the immersion medium is water.

33. The method of claim 24, wherein the top coating layer is formed by spin coating.

34. The method of claim 33, wherein the spin coating is performed at a rotational velocity in a range of about 500 to 3000 rpm and for a time in the range of about 30 to 90 seconds.

35. The method of claim 24, wherein the removing the water-insoluble top coating layer and the developing the exposed photoresist layer are performed at the same time.

36. The method of claim 35, wherein the removing the water-insoluble top coating layer and the developing the exposed photoresist layer are performed using an alkaline developing material.

37. The method of claim 24, wherein the exposing of the region of the photoresist layer comprises exposing the photoresist to a light source selected from the group consisting of a KrF excimer laser (248 nm), an ArF excimer laser (193 nm), and a $F_2$ excimer laser (157 nm).

38. The method of claim 24, wherein the photoresist layer comprises a positive resist composition.

39. The method of claim 24, wherein the photoresist layer comprises a negative resist layer.

40. The method of claim 24, wherein the polymer comprises the following repeat units:

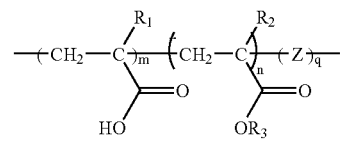

wherein $R_1$ and $R_2$ are independently selected from the group consisting of hydrogen, fluoro, methyl, and trifluoromethyl;
$R_3$ is a protecting group;
Z is a monomer selected from the group consisting of a vinyl monomer, an alkyleneglycol, a maleic anhydride, an ethyleneimine, an oxazoline-containing monomer, acrylonitrile, an allylamide, a 3,4-dihydropyran, a 2,3-dihydrofuran, tetrafluoroethylene, or a combination thereof; and m, n, and q are integers wherein $0.03 \leq m/(m+n+q) \leq 0.97$, $0.03 \leq n/(m+n+q) \leq 0.97$, $0 \leq q/(m+n+q) \leq 0.5$;

and wherein the solvent comprises deionized water.

41. The method of claim 40, wherein $R_3$ is selected from the group consisting of $C_1$ to $C_{10}$ alkyl, t-butyl, isonorbornyl, 2-methyl-2-adamantyl, 2-ethyl-2-adamantyl, 3-tetrahydrofuranyl, 3-oxocyclohexyl, γ-butyllactone-3-yl, mevalonic acid lactone, γ-butyrolactone-2-yl, 3-methyl-γ-butyrolactone-3-yl, 2-tetrahydropyranyl, 2-tetrahydrofuranyl, 2,3-propylenecarbonate-1-yl, 1-methoxyethyl, 1-ethoxyethyl, 1-(2-methoxyethoxy)ethyl, 1-(2-acetoxyethoxy)ethyl, t-butoxycarbonylmethyl, methoxymethyl, ethoxymethyl, or a combination thereof.

42. The method of claim 40, wherein the polymer has a weight average molecular weight ($M_w$) in a range of 1,000 to about 100,000 daltons.

43. The method of claim 40, wherein the concentration of the polymer is in a range of about 0.1 to about 5.0% by weight, based on the total weight of the top coating composition.

44. The method of claim 40, wherein the base comprises an amine or a tetraalkylammonium hydroxide.

45. The method of claim 44, wherein the base comprises ethylamine, ammonia, monoethanolamine, triethanolamine, tetramethylammonium hydroxide, or a combination thereof.

46. The method of claim 40, wherein the concentration of the base is in a range of about 0.01 to about 0.3% by weight, based on the total weight of the top coating composition.

47. The method of claim 40, wherein the top coating composition further comprises a surfactant.

48. The method of claim 47, wherein the concentration of the surfactant is in a range of about 0.001 to about 0.01 by weight based on the total weight of the top coating composition.

49. The method of claim 40, wherein the top coating composition further comprises a fluorinated additive, wherein the fluorinated additive is selected from the group consisting of tetramethylammonium trifluoroacetate, tetramethylammonium pentafluoropropionate, tetramethylammonium heptafluorobutyrate, tetramethylammonium nonafluorovalerate, tetramethylammonium undecafluorohexanate, tetramethylammonium tridecafluoroheptanate, tetramethylammonium pentadecafluorooctanate, tetramethylammonium heptadecafluorononanate, tetramethylammonium nonadecafluorodecanate, tetramethylammonium perfluoroundecanate, tetramethylammonium tricosafluorododecanate, tetramethylammonium perfluorotetradecanate, tetramethylammonium heptadecafluorooctanesulfonate, tetramethylammonium nonafluorobutane-1-sulfonate, or a combination thereof.

50. The method of claim 49, wherein the concentration of the fluorinated additive is in a range of about 0.01 to about 0.3% by weight based on the total weight of the top coating composition.

51. The method of claim 40, wherein the solvent further comprises an organic solvent.

52. The method of claim 51, wherein to ratio of deionized water to organic solvent is in the range of about 99:1 to about 50:50.

53. The method of claim 51, wherein the organic solvent comprises an alkanol, a nitrile, a ketone, an ester, a lactate ester, or a combination thereof.

* * * * *